United States Patent [19]

Potash

[11] Patent Number: 5,109,319

[45] Date of Patent: Apr. 28, 1992

[54] TERMINAL ARRANGEMENT FOR AXIAL LEAD ELECTRICALLY ASYMMETRIC ELECTRONIC COMPONENTS

[76] Inventor: Jerome Potash, 10 Molly Bee Rd., Flemington, N.J. 08822

[21] Appl. No.: 607,718

[22] Filed: Nov. 1, 1990

[51] Int. Cl.$^5$ .................... H05K 7/08; H01R 9/00
[52] U.S. Cl. .................... 361/405; 361/410; 174/260; 439/678; 439/679
[58] Field of Search .............. 361/409, 410, 400, 404, 361/405, 406, 417, 419, 420; 174/260, 262; 439/677, 678, 679

[56] References Cited

U.S. PATENT DOCUMENTS

| | | | |
|---|---|---|---|
| 2,819,434 | 1/1958 | Mattheyses | 439/679 X |
| 3,039,075 | 6/1962 | Stollman | 439/679 |
| 3,149,898 | 9/1964 | Klumpp, Jr. | 439/679 |
| 4,982,376 | 1/1991 | Megens et al. | 361/400 |
| 4,990,108 | 2/1991 | Sakaguchi | 439/678 |

FOREIGN PATENT DOCUMENTS

| | | | |
|---|---|---|---|
| 1113518 | 9/1961 | Fed. Rep. of Germany | 361/400 |
| 3600768 | 9/1987 | Fed. Rep. of Germany | 361/400 |

*Primary Examiner*—Leo P. Picard
*Assistant Examiner*—Paramita Ghosh
*Attorney, Agent, or Firm*—Arthur L. Lessler

[57] ABSTRACT

A diode or other axial lead electronic component which requires mounting of its leads in a predetermined orientation is provided with leads of considerably different diameter. A printed circuit board is provided with holes sized to receive respective leads, so that the leads can be inserted into the holes only one way. Instead of having circular cross-sections and different diameters, one lead may have a circular cross-section while all or an end portion of the other lead has a non-circular cross-section with a diameter allowing that lead to fit in only the larger hole of the printed circuit board.

2 Claims, 1 Drawing Sheet

TERMINAL ARRANGEMENT FOR AXIAL LEAD ELECTRICALLY ASYMMETRIC ELECTRONIC COMPONENTS

BACKGROUND OF THE INVENTION

This invention relates to axial lead electrically asymmetric electronic components and terminal arrangements for the mounting thereof.

An axial lead electrically asymmetric electronic component generally has a cylindrical body with an axial lead extending from each end thereof; and has electrical characteristics such that the leads cannot be interchanged in a circuit without destroying the device or impairing its performance. Such devices include polarized components such as diodes and electrolytic capacitors; and also include such nonpolarized components as foil capacitors wherein it is often desirable to ground the axial lead which is connected to the outer layer of foil.

In mounting such electrically asymmetric components to printed circuit boards, it is necessary to observe the markings on each component so as to place it in position with the proper orientation on the board; and it is easy for an error to be made wherein the leads are reversed.

Accordingly, an object of the present invention is to provide improved axial lead electrically asymmetric electronic components and a mounting arrangement therefore, wherein component reversal errors are greatly reduced or eliminated.

SUMMARY OF THE INVENTION

As herein described, there is provided an axial lead electrically asymmetric electronic component comprising a generally cylindrical body with a first lead extending axially from one end of the body and a second lead extending axially from the other end thereof. At least a first end portion of the first lead adjacent the end thereof remote from the component body has a transverse dimension substantially greater than any transverse dimension of a first end portion of the second lead adjacent the end thereof remote from the body. With this arrangement the first lead can only be inserted into a printed circuit board hole of substantially greater transverse dimension than that of a printed circuit board hole capable of closely receiving the second lead.

Also herein described is the combination of such a component with a printed circuit board having first and second holes therein, with the first hole having a substantially larger diameter than the second hole. At least a first end portion of the first lead has a transverse dimension substantially greater than the diameter of the second hole and less than the diameter of the first hole. At least a first end portion of the second lead has a transverse dimension less than the diameter of the second hole. With this arrangement the leads of the component may be inserted in the holes only with the first lead in the first hole and the second lead in the second hole.

IN THE DRAWING

DETAILED DESCRIPTION

Figure 1:
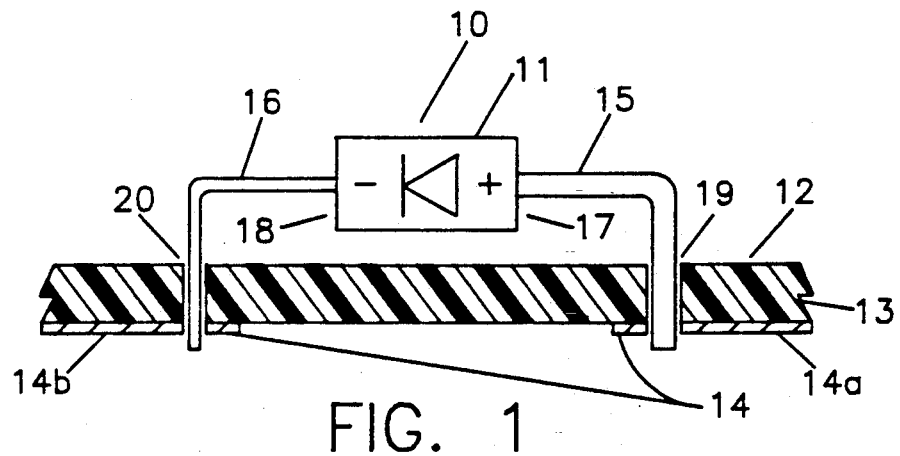
FIG. 1 is an elevation view showing an electrically asymmetric axial lead electronic component mounted to a printed circuit board (with the board shown in cross-section), according to a first and preferred embodiment of the present invention.

As shown in FIG. 1, an electrically asymmetric axial lead electronic component comprising a diode 10 has a cylindrical body 11 with a diode symbol and + and − polarity indicating signs printed thereon. The diode 11 is to be mounted to the top surface of a printed circuit board 12 having a plastic substrate 13 and metallization 14 on the bottom surface thereof. The diode is utilized in a circuit such that the diode must be mounted with the lead adjacent the + sign connected to a specific part of the circuit, i.e. wherein the diode must be connected in the circuit with a predetermined polarity.

Whereas a conventional electrically asymmetric axial lead electronic component has identical leads extending from opposite ends of the component body, the diode 10 has leads 15 and 16 of substantially different thickness extending from the opposite ends 17 and 18 of the body 11 respectively.

While the leads 15 and 16 of the diode 10 are of substantially different thickness, they are otherwise conventional, i.e. of copper or other suitable material and with circular cross-section.

The printed circuit board 12 has a relatively large diameter hole 19 and a relatively small diameter hole 20 for receiving the leads 15 and 16 respectively. Since the lead 15 is of larger diameter than the hole 20, it cannot be inserted into that hole. Therefore when the diode 10 is mounted to the printed circuit board 12 via the holes 19 and 20, its leads cannot be accidentally reversed during the mounting process; thereby insuring that the diode is mounted with the correct polarity.

The top surface of the printed circuit board preferably has markings thereon indicating that the diode 10 is to be installed with its positive lead 15 extending through the hole 19 and its negative lead 16 extending through the hole 20.

Once the diode has been mounted as described above, the portions of the leads 15 and 16 extending through the holes 19 and 20 respectively are soldered to corresponding circuit portions 14a and 14b of the metallization 14, to connect the diode 10 in circuit with the desired polarity.

Figure 2:
FIG. 2 shows cross-sections of the leads of an electrically asymmetric axial lead electronic component according to a second embodiment of the invention.

Instead of having leads which are both of circular cross-section, the diode 10 may have leads which are of different cross-sections For example, as shown in FIG. 2, the diode 10 may have a positive lead 15a of rectangular cross-section and a negative lead 16a of circular cross-section — in which event one hole in the circuit board 12 would have a circular cross-section for accepting the lead 16a but not the lead 15a, while the other hole therein would have a rectangular cross-section for receiving the lead 15a.

Figure 3:
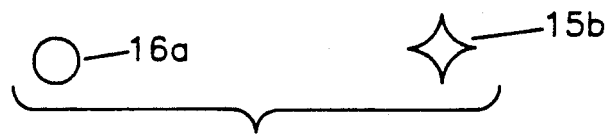
FIG. 3 shows cross-sections of end portions of the leads of an electrically asymmetric axial lead electronic component according to a third embodiment of the invention.

Rather than having the diode 10 initially made with special leads as described above with respect to FIGS. 1 and 2, off-the-shelf diodes with conventional identical leads can be purchased and subsequently modified as shown in FIG. 3 or FIG. 4.

In FIG. 3, the negative diode lead 16b is of conventional circular cross-section and dimensioned to fit into the circuit board hole 20, while the positive lead 15b has had the end portion thereof changed to a generally cross-shaped configuration by swaging, so that the overall diameter thereof has been increased to a size greater than the diameter of the hole 20 but less than the diameter of the hole 19. Thus the leads of the corresponding diode can be installed in the holes 19 and 20 only with the desired polarity. The swaged end portion of the positive lead 15b can be of any desired length but preferably does not extend beyond the place where the lead is to be bent to change its orientation from coaxial with the diode body to perpendicular to the portion of the lead adjacent the diode body.

Figure 4A:
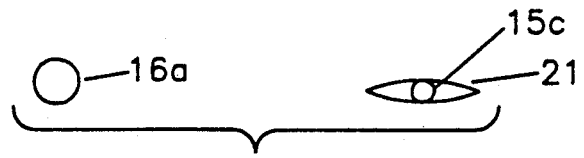
FIGS. 4a and 4b show an electrically asymmetric axial lead electronic component according to a fourth embodiment of the invention.
Figure 4B:
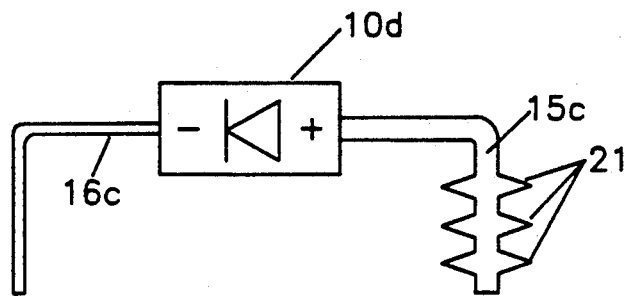

In the alternative arrangement of FIGS. 4a and 4b, the negative lead 16c is conventional and dimensioned to fit in the circuit board hole 20; while the positive lead 15c has a end portion with spaced-apart swaged regions 21. The regions 21 are formed so as to have an elongated shape with a dimension transverse to the lead 15c which is greater than the diameter of the hole 20 but less than the diameter of the hole 19. With this arrangement the swaging operation is simpler, since only small regions of the lead, rather than a continuous length thereof, need to be swaged, and the lead can be cut to the desired installation length while retaining the orientation feature, since a single swaged region 21 is adequate to insure correct orientation.

We claim:

1. An axial lead electrically asymmetric electronic component comprising a generally cylindrical body with a first lead extending axially from one end of said body and a second lead extending axially from the other end thereof, at least a first end portion of said first lead adjacent the end thereof remote from said body having a transverse dimension substantially greater than any transverse dimension of a first end portion of said second lead adjacent the end thereof remote from said body, at least part of said first end portion having a transversely extending region formed integrally therewith, so that said first lead can only be inserted into a printed circuit board hold of substantially greater transverse dimension than that of a printed circuit board hole capable of closely receiving said second lead.

2. An axial lead electrically asymmetric electronic component comprising a generally cylindrical body with a first lead extending axially from one end of said body and a second lead extending axially from the other end thereof, at least a first end portion of said first lead adjacent the end thereof remote from said body having a transverse dimension substantially greater than any transverse dimension of a first end portion of said second lead adjacent the end thereof remote from said body, at least part of said first end portion having a plurality of spaced-apart transversely extending regions formed integrally therewith, so that said first lead can only be inserted into a printed circuit board hole of substantially greater transverse dimension than that of a printed circuit board hole capable of closely receiving said second lead.

* * * * *